US012746501B2

(12) United States Patent
Yoo

(10) Patent No.: US 12,746,501 B2
(45) Date of Patent: Sep. 29, 2026

(54) EXHAUST SYSTEM AND EXHAUST METHOD USING BUFFER

(71) Applicant: Samsung Electronics Co., Ltd., Suwon-si (KR)

(72) Inventor: Changseok Yoo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 295 days.

(21) Appl. No.: 18/471,652

(22) Filed: Sep. 21, 2023

(65) Prior Publication Data

US 2024/0109017 A1 Apr. 4, 2024

(30) Foreign Application Priority Data

Sep. 29, 2022 (KR) ........................ 10-2022-0124522

(51) Int. Cl.

| | |
|---|---|
| ***B01D 47/06*** | (2006.01) |
| ***B01D 50/00*** | (2022.01) |
| ***B01D 53/00*** | (2006.01) |
| ***B01D 53/75*** | (2006.01) |
| ***C23C 16/44*** | (2006.01) |
| *B01D 53/58* | (2006.01) |
| *B01D 53/68* | (2006.01) |
| *B07B 7/01* | (2006.01) |
| *B07B 7/086* | (2006.01) |

(52) U.S. Cl.

CPC ............. *B01D 47/06* (2013.01); *B01D 50/00* (2013.01); *B01D 53/005* (2013.01); *B01D 53/75* (2013.01); *C23C 16/4412* (2013.01); *B01D 53/58* (2013.01); *B01D 53/68* (2013.01); *B01D 2258/0216* (2013.01); *B07B 7/01* (2013.01); *B07B 7/086* (2013.01)

(58) Field of Classification Search

None

See application file for complete search history.

(56) References Cited

U.S. PATENT DOCUMENTS 7,611,684 B2 11/2009 Johnsgard et al.
8,574,504 B2 11/2013 Kim et al.
(Continued)

FOREIGN PATENT DOCUMENTS

JP 2012-077924 A 4/2012
JP 5851198 B2 2/2016
(Continued)

OTHER PUBLICATIONS

Korean Office Action for corresponding Korean Application No. 10-2022-0124522 dated Apr. 30, 2026.

*Primary Examiner* — Gabriel E Gitman

(74) *Attorney, Agent, or Firm* — Harness, Dickey & Pierce, P.L.C.

(57) ABSTRACT

An exhaust system including a process chamber in which a semiconductor processing is performed, a buffer connected to the process chamber, the buffer configured to receive waste gas generated during the semiconductor processing and dualize and disperse powder generated from the waste gas may be provided, a reactor configured to burn the waste gas, a wet tank connected to the reactor, arranged below the reactor, and configured to store cleaning water, and a wet tower configured to decompose the powder in the waste gas by using the cleaning water may be provided.

18 Claims, 9 Drawing Sheets

(56) References Cited

U.S. PATENT DOCUMENTS

| | | | | |
|---|---|---|---|---|
| 9,895,644 | B2 | 2/2018 | Xia et al. | |
| 2012/0115098 | A1* | 5/2012 | Feng | F23G 7/065 431/182 |
| 2015/0322566 | A1* | 11/2015 | Goeres | C23C 16/4412 427/255.28 |
| 2021/0101099 | A1* | 4/2021 | Wang | B01D 8/00 |
| 2024/0082777 | A1* | 3/2024 | Ohmae | H05B 3/64 |

FOREIGN PATENT DOCUMENTS

| | | | |
|---|---|---|---|
| JP | 2021-098168 | A | 7/2021 |
| JP | 7140440 | B1 | 9/2022 |
| KR | 100208402 | B1 | 7/1999 |
| KR | 100325197 | B1 | 2/2002 |
| KR | 10-2003-0008540 | A | 1/2003 |
| KR | 100881286 | B1 | 2/2009 |
| KR | 100910875 | B1 | 8/2009 |
| KR | 100944146 | B1 | 2/2010 |
| KR | 20100011824 | A | 2/2010 |
| KR | 20150108908 | A | 9/2015 |
| KR | 101580368 | B1 | 1/2016 |
| KR | 20200044500 | A | 4/2020 |

* cited by examiner (a) (b)

EXHAUST SYSTEM AND EXHAUST METHOD USING BUFFER

CROSS-REFERENCE TO RELATED APPLICATION

This application is based on and claims priority under 35 U.S.C. § 119 to Korean Patent Application No. 10-2022-0124522, filed on Sep. 29, 2022, in the Korean Intellectual Property Office, the disclosure of which is incorporated by reference herein in its entirety.

BACKGROUND

The inventive concepts relate to exhaust systems and/or exhaust methods, which use a buffer, and more particularly, to exhaust systems and/or exhaust methods, which treat waste gas generated after a semiconductor process.

A semiconductor chip may be manufactured through various processes for a silicon wafer or the like. For example, a semiconductor chip may be manufactured through a deposition process, an etching process, a developing process, an exposure process, or the like. To manufacture a semiconductor chip, various materials may be used in liquid, gas, or plasma form. Gas discharged from a process chamber for manufacturing a semiconductor chip may include various contaminants. These contaminants can be harmful to humans or the environment. Therefore, it is necessary to treat contaminants before discharging the gas discharged from the process chamber to the outside.

SUMMARY

The inventive concepts provide exhaust systems and/or exhaust methods, which are capable of effectively mitigating or preventing a clogging phenomenon and blockage of pipes by waste gas in the pipes.

In addition, problems to be solved by the inventive concepts are not limited to the above-mentioned problems, and other problems can be clearly understood by those skilled in the art from the description below.

According to an aspect of the inventive concepts, an exhaust system may include a process chamber in which a semiconductor processing is performed, a buffer connected to the process chamber, the buffer configured to receive waste gas generated during the semiconductor processing and dualize and disperse powder generated from the waste gas, a reactor configured to burn the waste gas, a wet tank connected to the reactor, arranged below the reactor, and configured to store cleaning water, and a wet tower configured to decompose the powder in the waste gas by using the cleaning water According to another aspect of the inventive concepts, an exhaust system may include a process chamber in which a semiconductor processing is performed, a buffer connected to the process chamber and configured to receive waster gas generated during the semiconductor processing, the buffer including a lower internal space and an upper internal space, a first reactor configured to heat-treat and burn the waste gas, a plurality of valves between the buffer and the first, a wet tank connected to the first reactor, arranged below the first reactor, and configured to store cleaning water, a wet tower configured to perform cleaning treatment on the waste gas by using the cleaning water, and a controller configured to control opening and closing of the plurality of valves, the plurality of valves including a first valve and a second valve, wherein the buffer includes a first outlet in communication with the upper internal space and a second outlet in communication with the lower internal space, and is further configured to dualize and disperse powder generated from the waste gas, and the plurality of valves include the first valve configured to adjust fluid flow between the first outlet and the first reactor to each other and the second valve configured to adjust fluid flow between the second outlet and the first reactor to each other.

According to another aspect of the inventive concepts, an exhaust method may include performing a semiconductor processing, supplying waste gas generated during the semiconductor processing to a buffer, dualizing and dispersing the supplied waste gas by using the buffer, supplying the dispersed waste gas to at least one reactor, performing heat treatment on the supplied waste gas, and cleaning the heat-treated waste gas by using a cleaning water.

BRIEF DESCRIPTION OF THE DRAWINGS

Some example embodiments of the inventive concepts will be more clearly understood from the following detailed description taken in conjunction with the accompanying drawings in which.

DETAILED DESCRIPTION

Figure 1:
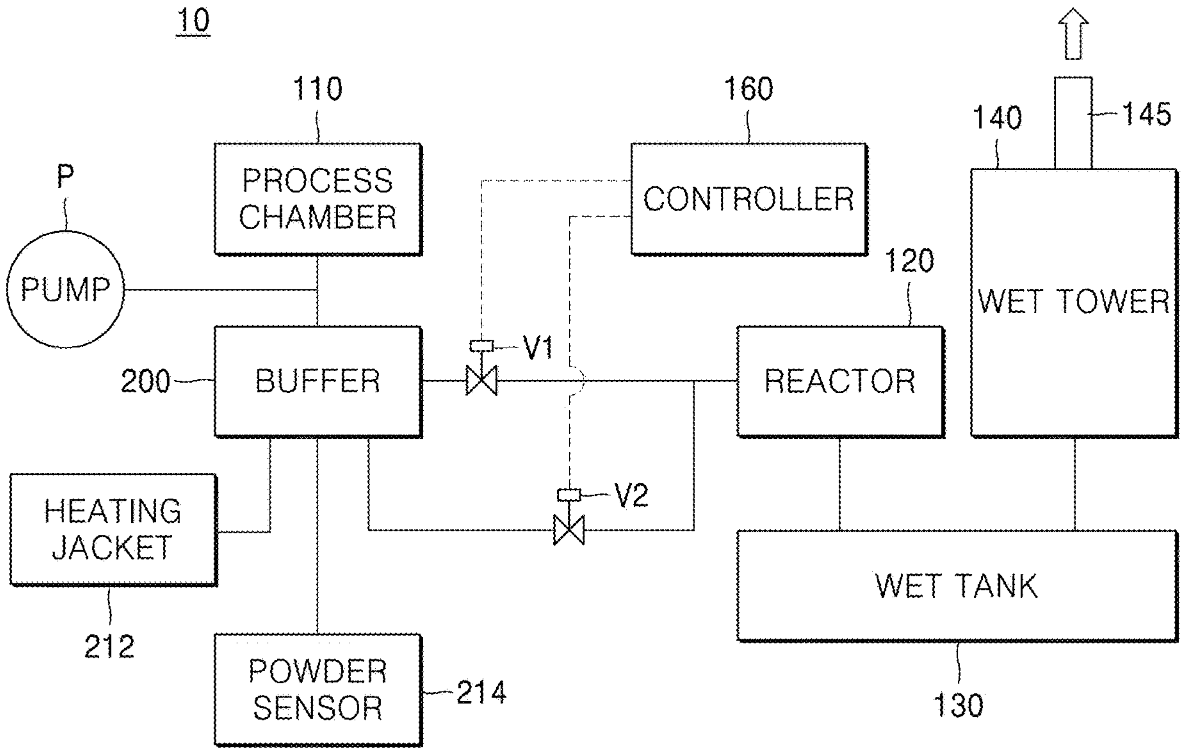
FIG. 1 is a block diagram for explaining an example configuration of an exhaust system using a buffer, according to an example embodiment.

The inventive concepts will now be described more fully with reference to the accompanying drawings, in which some example embodiments of the inventive concepts are shown. Like reference numerals in the drawings denote like elements, and thus their description will be omitted.

As used herein, expressions such as “at least one of,” when preceding a list of elements, modify the entire list of elements and do not modify the individual elements of the list. Thus, for example, both “at least one of A, B, or C” and “at least one of A, B, and C” mean either A, B, C or any combination thereof. Likewise, A and/or B means A, B, or A and B.

While the term “same,” “equal” or “identical” is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

FIG. 1 is a block diagram for explaining an example configuration of an exhaust system 10 using a buffer, according to an example embodiment.

Referring to FIG. 1, the exhaust system 10 may include a process chamber 110, a buffer 200, a reactor 120, a wet tank 130, a wet tower 140, and a controller 160.

A semiconductor process may be performed in the process chamber 110. Here, the semiconductor process may include processes for manufacturing a semiconductor. For example, a semiconductor process may include an ion implantation process, a deposition process, an exposure process, a developing process, an etching process, a cleaning process, a drying process, or the like. Waste gas generated during or after a semiconductor process may be discharged from the process chamber 110 through a pipe. The waste gas may be introduced into the buffer 200 through a pipe connecting the process chamber 110 and the buffer 200 to each other.

The waste gas generated during or after the semiconductor process may include at least one of a basic gas, an acid gas, and a volatile organic material. The basic gas may include, for example, ammonia (NH3) or the like. The acidic gas may include, for example, hydrochloric acid (HCl), hydrogen fluoride (HF), diborane ($B_2H_6$), boron trichloride ($BCl_3$), or the like. The waste gas generated during or after the semiconductor process may form a solid precipitate of silicon powders by a physical or chemical reaction in the pipe. For example, the solid precipitate may include solid particulates, such as $SiO_2$.

The buffer 200 may include an inlet 210 (refer to FIG. 2), a first outlet 220 (refer to FIG. 2), and a second outlet 230 (refer to FIG. 2), which are respectively connected to different pipes. The buffer 200 may include an internal space in which waste gas and power stay. The internal space may include a lower internal space BSP and an upper internal space TSP. The inlet 210 may be a tube arranged on one sidewall of the buffer 200. The first outlet 220 and the second outlet 230 may be tubes arranged on different sidewalls of the buffer 200, respectively. The first outlet 220 may be a pipe in communication with the upper internal space TSP of the internal space, and the second outlet 230 may be a pipe in communication with the lower internal space BSP of the internal space.

A first valve V1 may be installed between pipes connecting the first outlet 220 of the buffer 200 and the reactor 120 to each other. Also, a second valve V2 may be installed between the pipes connecting the second outlet 230 of the buffer 200 and the reactor 120 to each other. In other words, the first valve V1 may be installed between the first outlet 220 of the buffer 200 and the reactor 120 and adjust fluid flow between the first outlet 220 of the buffer 200 and the reactor 120. the second valve V2 may be installed between the second outlet 230 of the buffer 200 and the reactor 120 and adjust fluid flow between the second outlet 230 of the buffer 200 and the reactor 120.

The exhaust system 10 may further include a heating jacket 212 and a power powder sensor 214.

The heating jacket 212 may be in contact with the buffer 200 and heat the buffer 200. The heating jacket 212 may surround the buffer 200. The heating jacket 212 may mitigate or prevent powder generated from waste gas from being fixed on an inner wall of the buffer 200 by applying heat to the buffer 200.

The powder sensor 214 may be a sensor that measures the amount of powder generated in the buffer 200. Also, the powder sensor 214 may measure the amount of powder introduced into the buffer 200 from the process chamber 110. That is, the powder sensor 214 may be connected to the buffer 200 to measure the total amount of powder present in the buffer 200. The powder sensor 214 may transmit the measured amount of powder to the controller 160.

The controller 160 may control the opening and closing of the first valve V1 and the second valve V2. The controller 160 may control any one of the first valve V1 and the second valve V2, based on the amount of powder measured by the powder sensor 214.

The controller 160 may control the opening and closing of the first valve V1 and the second valve V2. The controller 160 may control any one of the first valve V1 and the second valve V2, based on the amount of powder measured by the power sensor 214.

In some example embodiments, the controller 160 may open the first valve V1 and close the second valve V2 when the amount of powder is lower than a desired (or alternatively, preset) reference value. In some example embodiments, the controller 160 may close the first valve V1 and open the second valve V2 when the amount of powder is lower than a desired (or alternatively, preset) reference value. Also, in some example embodiments, the controller 160 may open both of the first valve V1 and the second valve V2 when the amount of powder is higher than a desired (or alternatively, preset) reference value.

Waste gas generated during or after a semiconductor process may be introduced into the buffer 200 through the inlet 210. In other words, the buffer 200 may be configured to receive waste gas generated during or after a semiconductor process from the process chamber. Here, a pump P may be connected to a pipe connected to the process chamber 110 and the inlet 210. The pump P may provide flow power to the pipe.

The buffer 200 may retain waste gas in the internal space thereof for a certain period of time. The buffer 200 may dualize and disperse powder generated from the waste gas. For example, among the powder, first powder P1 having a relatively small particle size may be discharged through the first outlet 220. Further, among the powder, second powder P2 having a relatively large particle size may be discharged through the second outlet 230. The first powder P1 may have a lighter particle size than that of the second powder P2. Further, waste gas may be discharged through the first outlet 220 and the second outlet 230.

In addition, the buffer 200 may further include an ultrasonic vibrator (not shown) being in contact with the buffer 200 and configured to generate ultrasonic waves in the buffer 200. The ultrasonic vibrator may mitigate or prevent powder from being fixed or adhered to the inner wall of the buffer 200 by transmitting ultrasonic waves to the buffer 200.

Waste gas and powder (e.g., the first powder P1 and the second powder P2) may be introduced into the reactor 120 from the buffer 200 through a pipe connected to the buffer 200. The reactor 120 may burn the waste gas, the first powder P1, and the second powder P2. The reactor 120 may heat the waste gas, the first powder P1, and the second powder P2 to about 100° C. to about 1500° C. Accordingly, by-products generated from the waste gas, the first powder P1, and the second powder P2 may be primarily removed through the reactor 120. Further, the reactor 120 may decompose the waste gas at a high temperature by burning the waste gas. The waste gas, the first powder P1, and the second powder P2, which are heated by the reactor 120, may be introduced into the wet tank 130.

The wet tank 130 may be connected to the reactor 120 through a pipe. The wet tank 130 may be arranged below the reactor 120 and provide a storage space for cleaning water. The wet tank 130 may dissolve the first powder P1 and the second powder P2 included in the waste gas. For example, ammonia ($NH_3$), hydrochloric acid (HCl), or chlorine ($Cl_2$) may be dissolved in the cleaning water. Also, because the cleaning water includes water, the first powder P1 and the second powder P2 may be hydrolyzed.

The wet tower 140 may include a nozzle installed inside the wet tower 140. The wet tower 140 may spray the cleaning water to the waste gas through the nozzle. The wet tower 140 may purify the waste gas by using the cleaning water. Further the wet tower 140 may decompose powder in the waste gas. The powder of the waste gas may be secondarily removed and purified through the wet tank 130 and the wet tower 140. The wet tower 140 may include an exhaust pipe 145 arranged at an upper portion of the wet tower 140 and exhausting purified gas. Gas discharged through the exhaust pipe 145 may be finally purified gas and may not include powder or the like.

Figure 2:
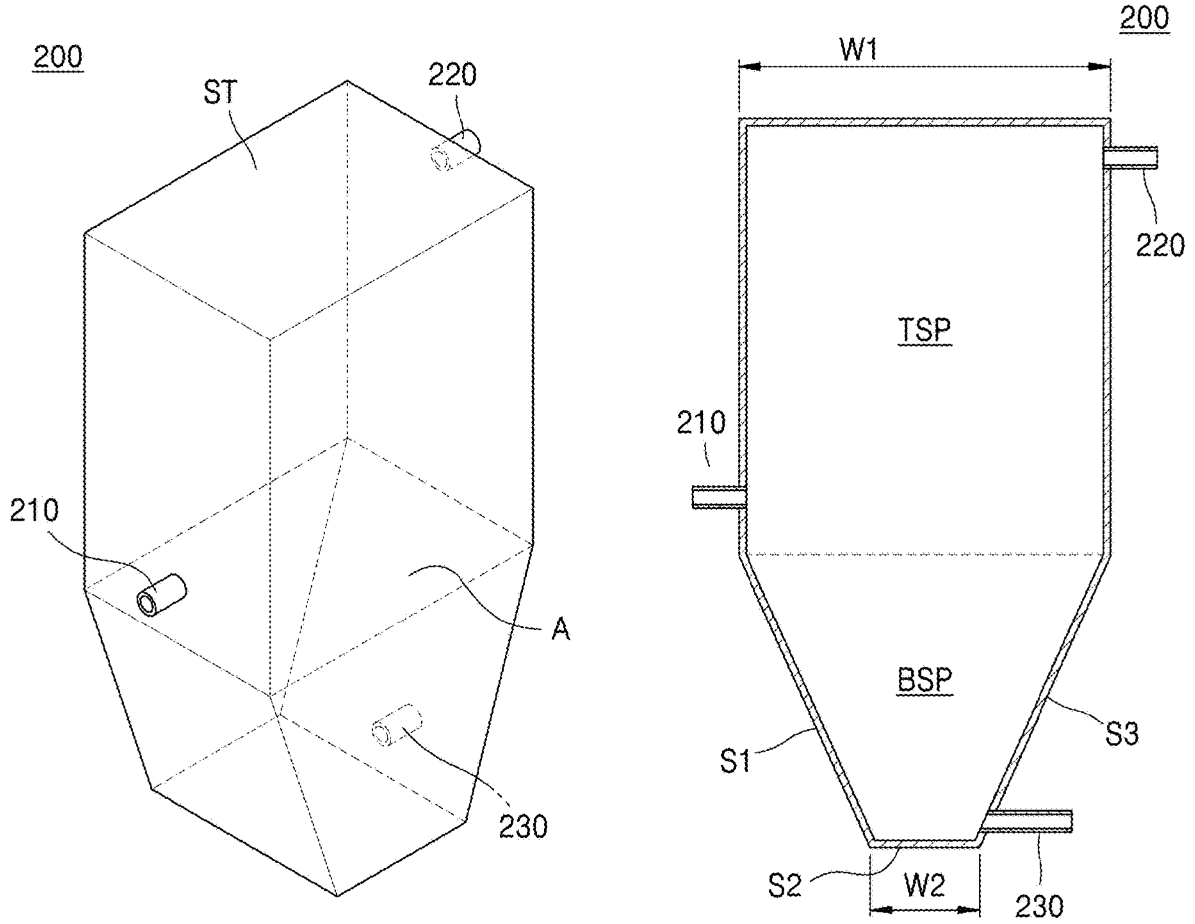
FIG. 2 shows a side view and a cross-sectional view, each schematically showing a buffer according to an example embodiment.
Figure 6:
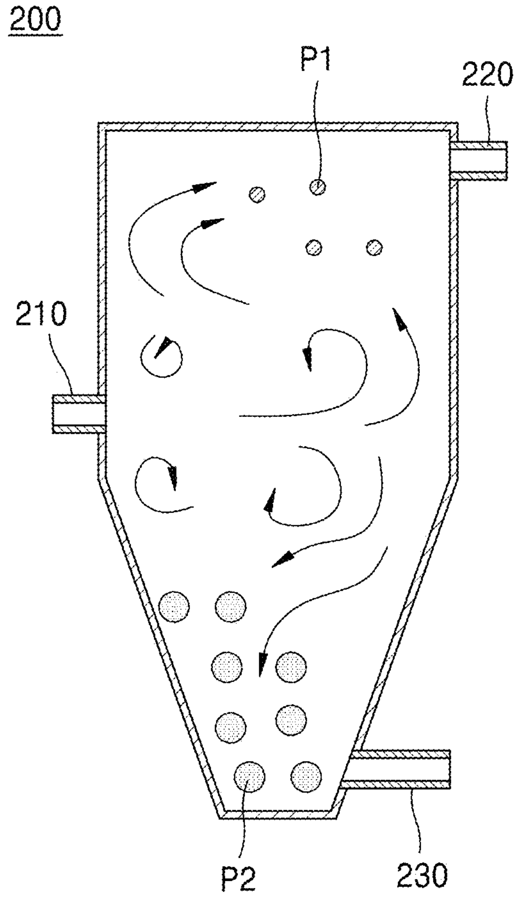
FIG. 6 is a cross-sectional view for explaining a flow of waste gas in a buffer according to an example embodiment.

FIG. 2 shows a side view and a cross-sectional view, each schematically showing a buffer according to an example embodiment. (a) of FIG. 2 is a side view of the buffer 200, and (b) of FIG. 2 is a cross-sectional view of the buffer 200. FIG. 6 is a cross-sectional view for explaining a flow of waste gas in a buffer according to an example embodiment.

Referring to (a) and (b) of FIG. 2, the width of a lower internal space BSP of the buffer 200 may decrease toward a lower portion of the lower internal space BSP. As shown in (b) of FIG. 2, the lower internal space BSP may have a tapered shape. Further, a bottom surface S2 of the lower internal space BSP of the buffer 200 may be a surface facing an upper surface ST of the buffer 200 and being parallel to a direction in which the second outlet 230 extends.

Referring to (a) of FIG. 2, the upper surface ST of the buffer 200 may face the bottom surface S2 of the buffer 200. A width W1 of the upper surface ST of the buffer 200 may be greater than a width W2 of the bottom surface S2 of the buffer 200. Here, a width may mean a width in a direction in which the first outlet 220 extends. An upper internal space TSP of the buffer 200 may have a rectangular parallelepiped structure.

Further, referring to (b) of FIG. 2 and FIG. 6, a cross section of the upper internal space TSP of the buffer 200 may be rectangular. A cross section of the lower internal space BSP of the buffer 200 may have a tapered shape or a trapezoidal shape in which an upper side is longer than a lower side. The upper internal space TSP of the buffer 200 may be greater than the lower internal space BSP of the buffer 200. A moving speed of the first powder P1 floating in the upper internal space TSP may be faster than a moving speed of the second powder P2 floating in the lower internal space BSP.

The buffer 200 may include a first sidewall S1, the bottom surface S2, and a second sidewall S3, which define the lower internal space BSP. The first sidewall S1 and the second sidewall S3 may be sidewalls extending in a straight-line shape. The internal space of the buffer 200 may be divided in the upper internal space TSP and the lower internal space BSP, based on a horizontal plane A including corners where the first sidewall S1 and the second sidewall S3 start to incline, respectively. The inlet 210 may be installed on the first sidewall S1, and the second outlet 230 may be installed on the second sidewall S3. A degree of inclination of the first sidewall S1 with respect to a vertical direction may equal to a degree of inclination of the second sidewall S3 with respect to the vertical direction. That is, the first sidewall S1 and the second sidewall S3 may be symmetrical to each other.

Waste gas and powder (e.g., the first powder P1 and the second powder P2) introduced through the inlet 210 may flow in the internal space of the buffer 200. The waste gas and powder may collide with the sidewalls of the buffer 200 to form vortices. At this time, the first powder P1, which has a relatively small particle size, may flow in the upper internal space TSP of the buffer 200. On the contrary, the second powder P2, which has a relatively large particle size, may sink into the lower internal space BSP of the buffer 200.

The waste gas, the first powder P1, and the second powder P2 may be discharged to the first outlet 220 or the second outlet 230 by flow power transmitted from the pump P. Here, the first powder P1 and the waste gas, which form a vortex around the first outlet 220, may be discharged through the first outlet 220. The second powder P2 and the waste gas, which form a vortex around the second outlet 230, may be discharged through the second outlet 230.

In some example embodiments, a diameter of each of the inlet 210, the first outlet 220, and the second outlet 230 may range from about 100 mm to about 150 mm. In some example embodiments, a diameter of each of the inlet 210, the first outlet 220, and the second outlet 230 may range from about 110 mm to about 140 mm. In some example embodiments, a diameter of each of the inlet 210, the first outlet 220, and the second outlet 230 may range from about 120 mm to about 130 mm.

Figure 3:
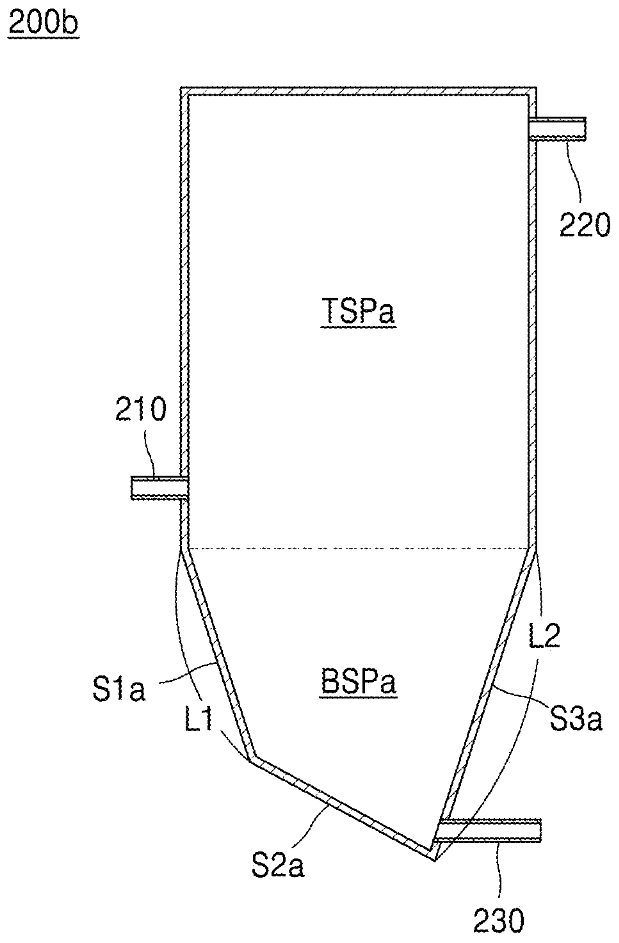
FIG. 3 is a cross-sectional view schematically showing a buffer according to an example embodiment.

FIG. 3 is a cross-sectional view schematically showing a buffer 200*a* according to an example embodiment. Descriptions same as those already given with reference to FIGS. 2 and 6 are omitted, and differences thereof are mainly described.

Referring to FIG. 3, a bottom surface S2*a* of the buffer 200*b* may be an inclined surface inclined in a direction from the first outlet 220 toward the second outlet 230. In other words, the bottom surface S2*a* of the buffer 200*b* may be an inclined surface inclined such that one end among of two opposite ends thereof is higher than the other end of the two opposite ends. By using the buffer 200*a* having the inclined bottom surface S2*a*, precipitation of the second powder P2 on one side surface of the bottom surface of the buffer 200*a* may be reduced. That is, the buffer 200 may facilitate the discharge of the second powder P2 by allowing the second powder P2 to flow to the second outlet 230 along the bottom surface S2*a*, which is inclined.

The buffer 200*a* may include a first sidewall S1*a*, a second sidewall S3*a*, and the bottom surface S2*a*, which define a lower internal space BSPa. A length L1 of the first sidewall S1*a* in an extension direction may be less than a length L2 of the second sidewall S3*a* in an extension direction. The first sidewall S1*a* and the second sidewall S3*a* may be sidewalls extending in a straight-line shape.

In some example embodiments, an angle at which the bottom surface S2*a* of the buffer 200 is inclined with respect to a direction in which the second outlet 230 extends may range from about 15° to about 20°. In some example embodiments, an angle at which the bottom surface S2*a* of the buffer 200 is inclined with respect to a direction in which the second outlet 230 extends may range from about 5° to about 30°.

Figure 4:
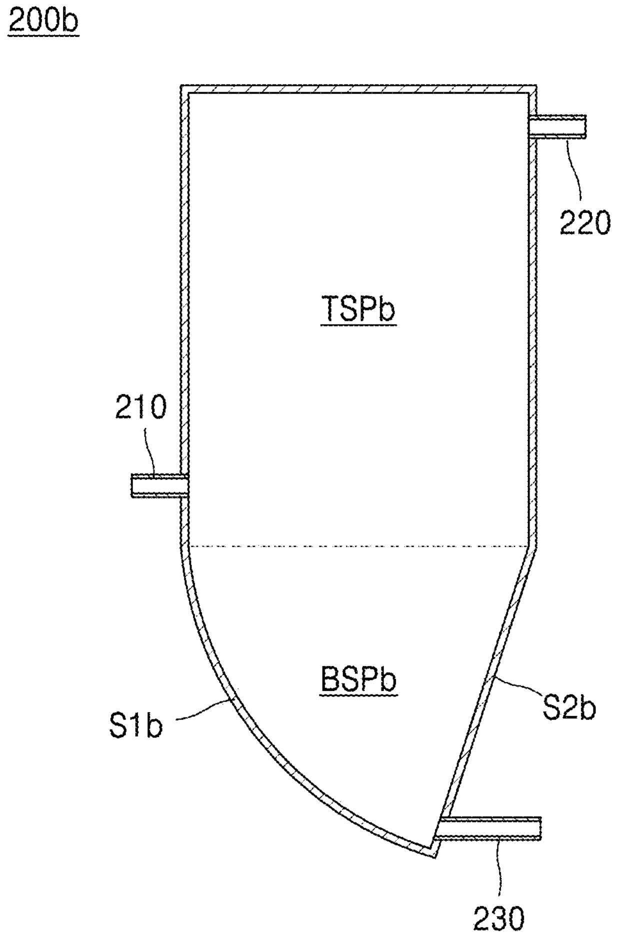
FIG. 4 is a cross-sectional view schematically showing a buffer according to an example embodiment.

FIG. 4 is a cross-sectional view schematically showing a buffer 200*b* according to an example embodiment.

Referring to FIG. 4, the buffer 200*b* may include a first sidewall S1*b* and a second sidewall S2*b*, which define a lower internal space BSPb. The first sidewall S1*b* may come into contact with the second sidewall S3*b* at one corner or at one point. The first sidewall S1*b* may extend in a curved shape and may be a rounded sidewall. The second sidewall S3*b* may be a sidewall extending in a straight-line shape.

The second powder P2 precipitated in the lower internal space BSPb may be precipitated along the first sidewall S1*b* or the second sidewall S3*b*. The second powder P2 may be precipitated at a location adjacent to the second outlet 230, and may be discharged to the second outlet 230 by pressure applied from the pump P.

Here, because the first sidewall S1*b* and the second sidewall S3*b* extend in a curved and straight-line shape, respectively, a phenomenon in which powder is adhered on the first sidewall S1*b* and the second sidewall S3*b* may be reduced or prevented.

Figure 5:
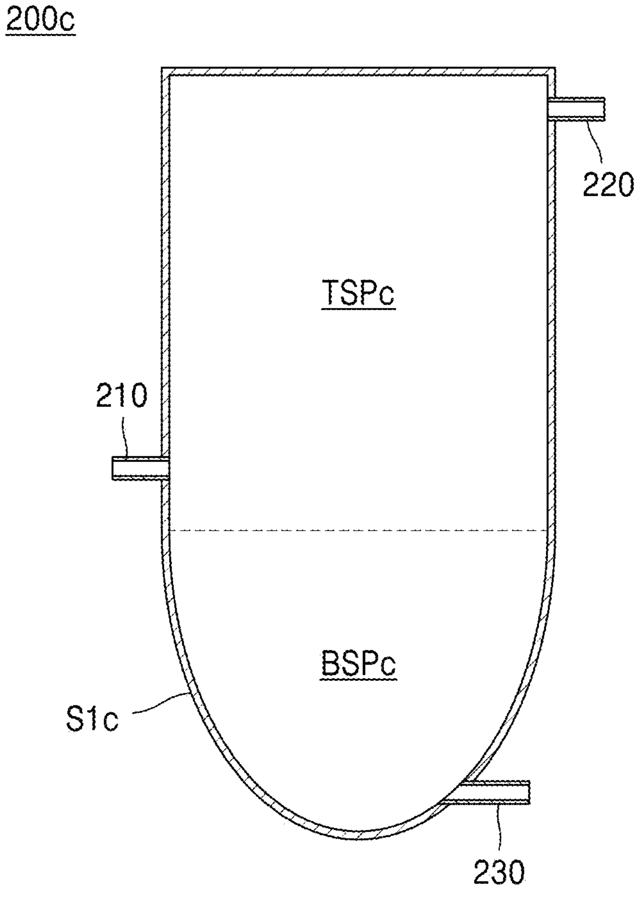
FIG. 5 is a cross-sectional view schematically showing a buffer according to an example embodiment.

FIG. 5 is a cross-sectional view schematically showing a buffer 200*c* according to an example embodiment.

Referring to FIG. 5, the buffer 200*c* may include a sidewall S1*c* defining a lower internal space BSPc thereof. The width of the lower internal space BSPc may decrease toward a lower portion of the buffer 200*c*. The sidewall S1*c* may be a surface extending in a curved shape. Here, the width of a lower internal space BSPc may decrease toward a lower portion thereof.

The sidewall S1*c* may have a symmetrical shape with respect to a central axis of the buffer 200*c* in a vertical direction. An upper internal space TSPc and the lower internal space BSPc of the buffer 200c may be divided by a horizontal plane including corners, from each of which the curved surface of the sidewall S1*c* starts.

The upper internal space TSPc of the buffer 200*c* may be greater than the lower internal space BSPc of the buffer 200*c*. The second powder P2 floating in the lower internal space BSPc may be precipitated at the lowest end of the lower internal space BSPc in a vertical level, and may be discharged through the second outlet 230 by pressure applied from the pump P.

Figure 7:
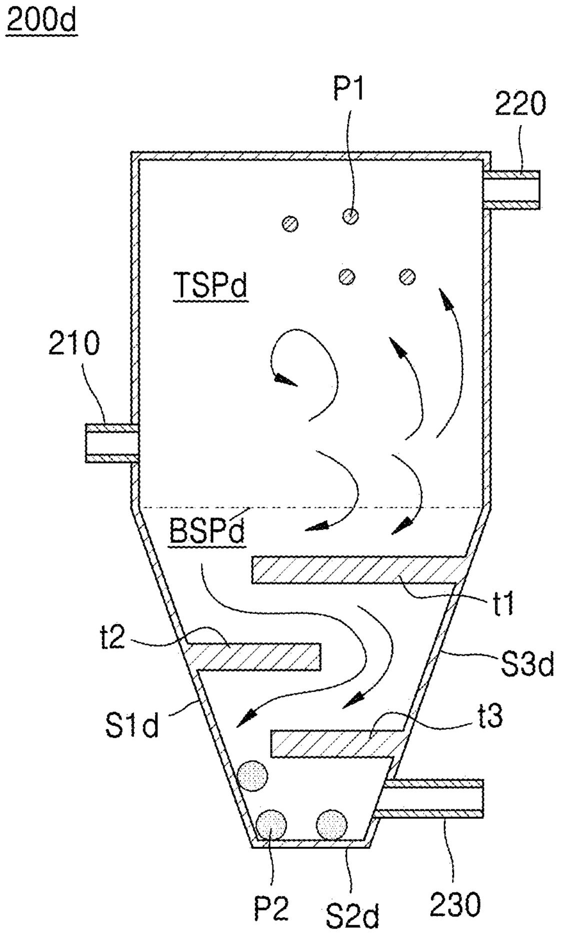
FIG. 7 is a cross-sectional view schematically showing a buffer according to an example embodiment.

FIG. 7 is a cross-sectional view schematically showing a buffer 200*d* according to an example embodiment. Herein, differences from the buffer 200 shown in FIG. 2 are mainly described.

Referring to FIG. 7, the buffer 200*d* may include a plurality of buffer members t1, t2, and t3. The plurality of buffer members t1, t2, and t3 may be arranged in a lower internal space BSPd of the buffer 200*d*. Here, the lower internal space BSPd may be defined by a first sidewall S1*d*, a bottom surface S2*d*, and a second sidewall S3*d*.

The plurality of buffer members t1, t2, and t3 may extend in parallel to the bottom surface S2*d* from the first and second sidewalls S1*d* and S3*d* of the buffer 200*d*, respectively. That is, the extension directions of the plurality of buffer members t1, t2, and t3 and the extension direction of the bottom surface S2*d* may be parallel to each other. A width of each of the plurality of buffer members t1, t2, and t3 in a horizontal direction may be less than a width of an upper surface of the buffer 200*d*. In addition, the width of each of the plurality of buffer members t1, t2, and t3 in the horizontal direction may be greater than or equal to the width of the bottom surface S2*d* of the buffer 200*d*.

Also, the plurality of buffer members t1, t2, and t3 may be arranged in a zigzag pattern, when viewed in a cross-section, in the lower internal space BSPd to delay the retention of the powder (e.g., the second powder P2) in the buffer 200*d*. The second powder P2 may form a flow in an S direction (e.g., along an S shaped path) in the lower internal space BSPd.

Figure 8:
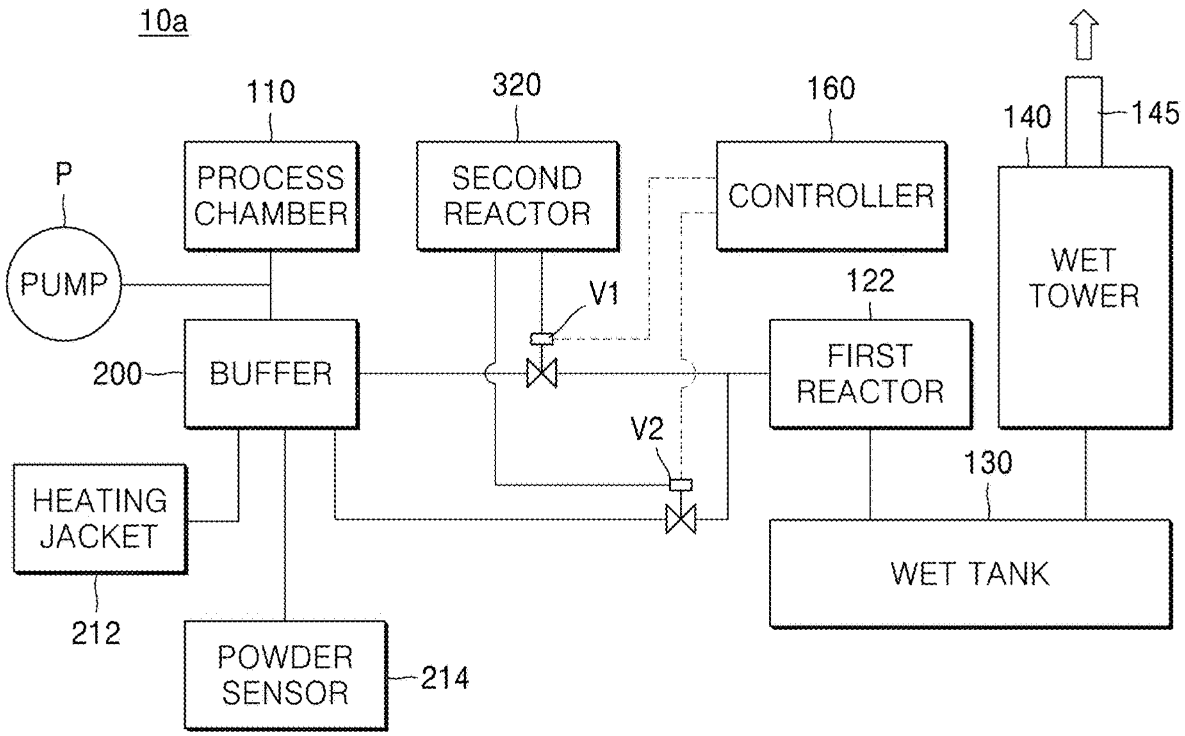
FIG. 8 is a block diagram for explaining an example configuration of an exhaust system according to an example embodiment.

FIG. 8 is a block diagram for explaining an example configuration of an exhaust system 10*a* according to an example embodiment. Hereinafter, differences from the exhaust system 10 of FIG. 1 are mainly described.

Referring to FIG. 8, the exhaust system 10*a* may include a first valve V1, a second valve V2, a controller 160, a first reactor 122, and a second reactor 320. The first reactor 122 may correspond to the reactor 120 of the exhaust system 10. Each of the first reactor 122 and the second reactor 320 may perform the same function as the reactor 120 of the exhaust system 10.

The second reactor 320 may belong to a separate exhaust system arranged in parallel with the exhaust system 10*a*. For example, the second reactor 320 may be connected to a separate pipe other than a pipe connected to the first valve V1 or the second valve V2. Further, the second reactor 320 may be connected to a separate wet tank and wet tower, which perform the same functions as the wet tank 130 and the wet tower 140 of the exhaust system 10, respectively.

That is, the second reactor 320 may belong to a separate exhaust system arranged in parallel with the exhaust system 10*a* and performing the same function as the exhaust system 10*a*. That is, the exhaust system 10*a* may correspond to a first exhaust system, and the exhaust system to which the second reactor 320 belongs may correspond to a second exhaust system. The second exhaust system may include the same components as that of the first exhaust system. For example, the second exhaust system may include a process chamber, a buffer, a powder sensor, a heating jacket, a reactor, a controller, a wet tank, a wet tower, a pipe, or the like.

Here, the first valve V1 and the second valve V2 may each be a three-way valve. A pipe branched from the buffer 200 may be connected to the first reactor 122 or the second reactor 320 through the first valve V1 and the second valve V2.

In some example embodiments, the controller 160 may open and close the first valve V1 and the second valve V2. In some example embodiments, when a pipe connecting the first outlet 220 and the first reactor 122 to each other is clogged, the controller 160 may control the first valve V1 to allow waste gas and powder to flow from the buffer 200 to the second reactor 320.

For example, the controller 160 may block waste gas flowing from the buffer 200 to the first reactor 122 by closing a portion of the first valve V1, the portion being connected to the first reactor 122. Further, the controller 160 may allow waste gas to flow from the buffer 200 to the second reactor 320 by opening a portion of the first valve V1, the portion being connected to the second reactor 320.

Also, in some example embodiments, when a pipe connecting the second outlet 230 and the first reactor 122 to each other is clogged, the controller 160 may control the second valve V2 to allow the waste gas and powder to flow from the buffer 200 to the second reactor 320. The case in which a pipe is clogged may mean a case in which waste gas and powder in the pipe may not flow due to the powder (e.g., the first powder P1 or the second powder P2) accumulated in the pipe.

For example, the controller 160 may block waste gas flowing from the buffer 200 to the first reactor 122 by closing a portion of the second valve V2, the portion being connected to the first reactor 122. Further, the controller 160 may allow waste gas to flow from the buffer 200 to the second reactor 320 by opening a portion of the second valve V2, the portion being connected to the second reactor 320.

Figure 9:
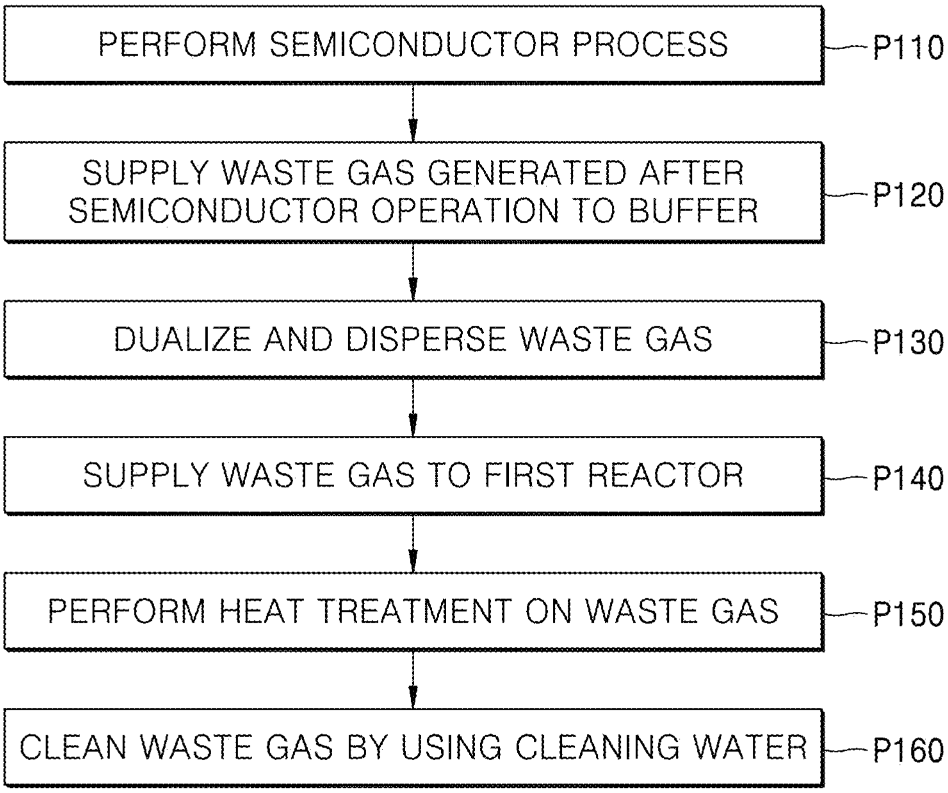
FIG. 9 is a flowchart illustrating an exhaust method using a buffer, according to an example embodiment.

FIG. 9 is a flowchart illustrating an exhaust method using a buffer, according to an example embodiment. Here, descriptions are made with reference to the structure of the buffer 200 of FIG. 2.

Referring to FIGS. 8 and 9, an exhaust method using a buffer according to an example embodiment may firstly perform a semiconductor process of manufacturing a semiconductor device in operation P110. Here, the semiconductor process may be performed in the process chamber 110. The semiconductor process may include an ion implantation process, a deposition process, an exposure process, a developing process, an etching process, a cleaning process, a drying process, or the like. Waste gas may be generated in the process chamber 110 as a by-product of the semiconductor process. The process chamber 110 may discharge the waste gas through an exhaust port (not shown) of the process chamber 110.

Referring to FIGS. 8 and 9, after performing the semiconductor process, the waste gas generated during or after the semiconductor process may be supplied to the buffer 200 in operation P120. Here, the waste gas may flow from the exhaust port of the process chamber 110 to the buffer 200 by the pump P. The waste gas may be supplied to the inlet 210 installed on a sidewall of the buffer 200.

After the waste gas is supplied to the buffer 200, the buffer 200 may dualize and disperse the waste gas. Here, dualizing and dispersing may mean dividing and discharging waste gas and powder generated from the waste gas into powder having a relatively small particle size (e.g., the first powder P1 of FIG. 6) and powder having a relatively large particle size (e.g., the second powder P2 of FIG. 6). Further, the dualizing and dispersing may mean dividing and discharging gas having a relatively light component and gas having a relatively heavy component in the waste gas.

For example, the buffer 200 may discharge the first powder P1 having a relatively light component among the powder supplied through the inlet 210 through the first outlet 220, and may discharge the second powder P2 having a relatively heavy component through the second outlet 230. Because the buffer 200 has a tapered shape in which the width of the buffer 200 in a vertical direction is greater than the width in a horizontal direction, the first powder P1 having a relatively light component may move to the upper internal space TSP of the buffer 200, and the second powder P2 having a relatively heavy component may move to the lower internal space BSP of the buffer 200.

Further, the buffer 200 may discharge gas having a relatively light component among waste gas supplied through the inlet 210 through the first outlet 220, and may discharge the second powder P2 having a relatively heavy component through the second outlet 230. In some example embodiments, the first powder P1 or the second powder P2 to be discharged through the first outlet 220 or the second outlet 230 may be powder generated in a pipe connecting the process chamber 110 and the buffer 200 to each other. In some example embodiments, the first powder P1 or the second powder P2 to be discharged through the first outlet 220 or the second outlet 230 may be powder generated by a physical or chemical reaction while waste gas stays in the buffer 200.

The disclosure may mitigate or prevent pipe clogging due to rapid introduction of waste gas and powder and control the flow of waste gas and powder without a separate trap by retaining and dualizing and dispersing the waste gas and powder through the buffer 200. The disclosure may mitigate or prevent introduction of excessive waste gas and powder into a reactor and mitigate or prevent failure of an exhaust system by diverging waste gas and powder flowing in a pipe by using the buffer 200 as well as the first valve V1 and the second valve V2.

Referring to FIGS. 8 and 9, after dualizing and dispersing the waste gas through the buffer 200, the waste gas may be supplied to the first reactor 122 in operation P140. The waste gas may be introduced into the first reactor 122 through a pipe connecting the buffer 200 and the first reactor 122 to each other. Here, the first valve V1 or the second valve V2 may be installed in the pipe connecting the buffer 200 and the first reactor 122 to each other. The waste gas and the first powder P1 discharged through the first outlet 220 may be supplied to the first reactor 122 through the first valve V1. Furthermore, the waste gas and the second powder P2 discharged through the second outlet 230 may be supplied to the first reactor 122 through the second valve V2.

Operation P140 of supplying waste gas to the first reactor 122 may include selectively supplying the waste gas to at least one of the first reactor 122 and the second reactor 320 by opening and closing a plurality of valves connecting the buffer 200, the first reactor 122, and the second reactor 320 arranged in parallel with the first reactor 122 to each other, based on the amount of powder generated from the waste gas. Here, the plurality of valves may include the first valve V1 and the second valve V2 of FIG. 8. The amount of powder generated from waste gas may mean an amount of powder stacked in a pipe connecting the buffer 200 and the first reactor 122 to each other. Further, the controller 160 may calculate the amount of the powder, based on a flow rate, flow amount, and pressure of the waste gas flowing in the pipe.

For example, the controller 160 may close the pipe connecting the buffer 200 and the first reactor 122 to each other by using the first valve V1 and the second valve V2, thereby blocking waste gas supplied from the buffer 200 to the first reactor 122. At the same time, the controller 160 may open a pipe connecting the buffer 200 and the second reactor 320 to each other by using the first valve V1 and the second valve V2, thereby supplying waste gas from the buffer 200 to the second reactor 320.

On the contrary, the controller 160 may open the pipe connecting the buffer 200 and the first reactor 122 to each other by using the first valve V1 and the second valve V2, thereby supplying the waste gas from the buffer 200 to the first reactor 122. At the same time, the controller 160 may close the pipe connecting the buffer 200 and the second reactor 320 to each other by using the first valve V1 and the second valve V2, thereby blocking waste gas to be supplied from the buffer 200 to the second reactor 320.

When it is determined that a pipe is clogged based on the amount of powder stacked in the pipe connecting the buffer 200 and the first reactor 122 to each other, the controller 160 may close the pipe connecting the buffer 200 and the first reactor 122 to each other and supply waste gas to the second reactor 320. However, in a case where it is not determined that a pipe is clogged, the controller 160 may maintain a state of closing the pipe connecting the buffer 200 and the second reactor 320 to each other by using the first valve V1 and the second valve V2.

After the waste gas is supplied to the first reactor 122, heat treatment may be performed on the waste gas in the first reactor 122 in operation P150. Here, the waste gas may include powder (e.g., the first powder P1 or the second powder P2). The powder may be powder generated in a pipe connecting the buffer 200 and the first reactor 122 to each other, and may be generated from waste gas in all pipes in the exhaust system 10*a*.

The waste gas and powder in the waste gas may be burned through a heating member (not shown) installed in the first reactor 122. Further, the first reactor 122 may include a cooling member (not shown), and may cool again high-temperature waste gas and powder through the cooling member after burning the waste gas and powder through the heating member. Thereafter, the waste gas and powder may be supplied to the wet tank 130 and the wet tower 140.

After heat treatment is performed on the waste gas, the waste gas may be cleaned by using cleaning water. Cleaning treatment for waste gas may be performed in the wet tank 130 and the wet tower 140. For example, the burnt waste gas and powder may be dissolved while passing through cleaning water stored in a storage space of the wet tank 130. In addition, waste gas and powder, which are unreacted in the wet tank 130, may be washed again by cleaning water sprayed by a plurality of nozzles of the wet tower 140. Accordingly, gas discharged through the wet tower 140 may be purified gas and may not contain powder.

While the inventive concepts have been particularly shown and described with reference to some example embodiments thereof, it will be understood that various changes in form and details may be made therein without departing from the spirit and scope of the following claims.

What is claimed is:

1. An exhaust system comprising:

a process chamber in which a semiconductor processing is performed;

a buffer connected to the process chamber, the buffer configured to receive waste gas generated during the semiconductor processing and dualize powder generated from the waste gas into a first powder having a relatively small particle size and a second powder having a relatively large particle size, the buffer including an internal space divided into a lower internal space and an upper internal space, the buffer further including an inlet, a first outlet, and a second outlet, the inlet being on one side of the buffer, the first outlet and the second outlet being on upper and lower portions of an opposite side of the buffer, respectively, the first outlet in communication with the upper internal space of the internal space and configured to output the first powder and the second outlet in communication with the lower internal space of the internal space and configured to output the second powder;

a reactor configured to burn the waste gas;

a wet tank connected to the reactor, arranged below the reactor, and configured to store cleaning water; and a wet tower configured to decompose the powder in the waste gas by using the cleaning water.

2. The exhaust system of claim 1, wherein a width of the lower internal space of the buffer decreases toward a lower portion of the lower internal space.

3. The exhaust system of claim 2, wherein a bottom surface of the lower internal space comprises an inclined surface inclined such that ene a first end among of two opposite ends thereof is higher than a second end of the two opposite ends.

4. The exhaust system of claim 2, wherein a bottom surface of the lower internal space comprises a horizontal surface.

5. The exhaust system of claim 2, wherein the lower internal space is defined by sidewalls each extending in a straight-line shape.

6. The exhaust system of claim 2, wherein the lower internal space is defined by sidewalls each extending in a curved shape.

7. The exhaust system of claim 1, further comprising:

a heating jacket being in contact with the buffer and configured to heat the buffer.

8. The exhaust system of claim 1, further comprising:

an ultrasonic vibrator being in contact with the buffer and configured to generate ultrasonic waves in the buffer.

9. The exhaust system of claim 4, further comprising:

a plurality of buffer members arranged in the lower internal space of the buffer, the plurality of buffer members extending from sidewalls of the buffer and being parallel with the bottom surface.

10. The exhaust system of claim 9, wherein the plurality of buffer members are arranged in a zigzag pattern to delay retention of the powder.

11. An exhaust system comprising:

a process chamber in which a semiconductor processing is performed;

a buffer connected to the process chamber and configured to receive gas generated during the semiconductor processing, the buffer including a lower internal space and an upper internal space;

a first reactor configured to heat-treat and burn the waste gas;

a plurality of valves between the buffer and the first reactor;

a wet tank connected to the first reactor, arranged below the first reactor, and configured to store cleaning water;

a wet tower configured to perform a cleaning treatment on the waste gas by using the cleaning water; and a controller configured to control opening and closing of the plurality of valves, the plurality of valves including a first valve and a second valve, wherein the buffer comprises a first outlet in communication with the upper internal space and a second outlet in communication with the lower internal space, and is further configured to dualize powder generated from the waste gas, and the plurality of valves comprise the first valve configured to adjust a first fluid flow between the first outlet and the first reactor and the second valve configured to adjust a second fluid flow between the second outlet and the first reactor.

12. The exhaust system of claim 11, wherein the buffer is further configured to discharge a first powder having a relatively small particle size through the first outlet and to discharge a second powder having a relatively large particle size through the second outlet.

13. The exhaust system of claim 11, wherein each of the first valve and the second valve comprises a three-way valve, and each of the first valve and the second valve is connected to a second reactor.

14. The exhaust system of claim 13, wherein the controller is further configured to:

control the first valve to allow the waste gas to flow from the buffer to the second reactor when a pipe connecting the first outlet and the first reactor to each other is clogged; and control the second valve to allow the waste gas to flow from the buffer to the second reactor when a pipe connecting the second outlet and the first reactor to each other is clogged.

15. The exhaust system of claim 11, further comprising:

a powder sensor configured to measure an amount of the powder generated from the waste gas, wherein the controller is further configured to open and close any one of the first valve and the second valve, based on the amount of the powder measured by the powder sensor.

16. The exhaust system of claim 11, wherein a width of the lower internal space of the buffer decreases toward a lower portion of the lower internal space, and a bottom surface of the lower internal space comprises a horizontal surface.

17. An exhaust method comprising:

performing a semiconductor processing;

supplying waste gas generated during the semiconductor processing to a buffer;

dualizing powder in the waste gas by using the buffer, wherein the dualizing comprises dualizing the powder generated from the waste gas into a first powder having a relatively small particle size and a second powder having a relatively large particle size;

supplying the waste gas, the first powder, and the second powder to at least one reactor;

performing heat treatment on the waste gas that has been supplied; and cleaning the waste gas that has been heat-treated by using a cleaning water.

18. The exhaust method of claim 17, wherein the at least one reactor includes a first reactor and a second reactor being in parallel with the first reactor, and the supplying the waste gas, the first powder, and the second powder comprises selectively supplying the waste gas, the first powder, and the second powder to at least one of the first reactor and the second reactor by opening and closing a plurality of valves connecting the buffer, the first reactor, and the second reactor, based on an amount of powder generated from the waste gas.

* * * * *